United States Patent
Motika et al.

(10) Patent No.: US 11,079,433 B2
(45) Date of Patent: Aug. 3, 2021

(54) LOGIC BUILT-IN SELF TEST DYNAMIC WEIGHT SELECTION METHOD

(71) Applicant: International Business Machines Corporation, Armonk, NY (US)

(72) Inventors: Franco Motika, Hopewell Junction, NY (US); Mary P. Kusko, Hopewell Junction, NY (US); Eugene Atwood, Housatonic, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/693,434

(22) Filed: Nov. 25, 2019

(65) Prior Publication Data

US 2021/0156911 A1    May 27, 2021

(51) Int. Cl.
*G01R 31/00* (2006.01)
*G01R 31/3177* (2006.01)
*G01R 31/317* (2006.01)

(52) U.S. Cl.
CPC ..... *G01R 31/3177* (2013.01); *G01R 31/3172* (2013.01); *G01R 31/31723* (2013.01); *G01R 31/31724* (2013.01)

(58) Field of Classification Search
None
See application file for complete search history.

(56) References Cited

U.S. PATENT DOCUMENTS

| | | | |
|---|---|---|---|
| 4,687,988 A | 8/1987 | Eichelberger et al. | |
| 4,688,223 A | 8/1987 | Motika et al. | |
| 4,745,355 A | 5/1988 | Eichelberger et al. | |
| 4,801,870 A | 1/1989 | Eichelberger et al. | |
| 5,983,380 A * | 11/1999 | Motika | G01R 31/318385 714/733 |

(Continued)

FOREIGN PATENT DOCUMENTS

| WO | 9945667 A1 | 9/1999 |
|---|---|---|
| WO | 02052288 A2 | 7/2002 |

OTHER PUBLICATIONS

J. A. Waicukauski, E. Lindbloom, E. B. Eichelberger and O. P. Forlenza, "A method for generating weighted random test patterns," in IBM Journal of Research and Development, vol. 33, No. 2, pp. 149-161, Mar. 1989, doi: 10.1147/rd.332.0149. (Year: 1989).*

(Continued)

*Primary Examiner* — Daniel F. McMahon
(74) *Attorney, Agent, or Firm* — Monchai Chuaychoo; Edward J Wixted, III

(57) ABSTRACT

An approach for testing, including a self-test method, a semiconductor chip is disclosed. The approach generates test patterns, including weighted random test patterns, for testing random pattern resistant faults, and un-modeled faults directed at specific logic groups, where the dynamically generated test pattern weights are configured to optimize test coverage and test time. The dynamically generated test patterns are based on factors related to random pattern resistant logic structures interconnected via scan chains. More particularly, the dynamically generated test patterns are designed to enable fault detection within logic structures that are resistant to fault detection when tested with random patterns.

18 Claims, 7 Drawing Sheets

(56) References Cited

U.S. PATENT DOCUMENTS

| | | | |
|---|---|---|---|
| 6,671,838 B1* | 12/2003 | Koprowski | G01R 31/318385 |
| | | | 324/750.3 |
| 6,795,948 B2 | 9/2004 | Lin et al. | |
| 6,968,489 B2 | 11/2005 | Motika et al. | |
| 7,028,239 B2 | 4/2006 | Jaber | |
| 7,162,674 B2 | 1/2007 | Nozuyama | |
| 7,302,624 B2 | 11/2007 | Rajski et al. | |
| 7,484,153 B2 | 1/2009 | Kiryu et al. | |
| 7,526,696 B2 | 4/2009 | Xiang et al. | |
| 7,681,098 B2 | 3/2010 | Kiryu | |
| 7,840,865 B2 | 11/2010 | Lai et al. | |
| 9,568,552 B2 | 2/2017 | Lin et al. | |
| 9,933,485 B2 | 4/2018 | Mrugalski et al. | |
| 2002/0087931 A1 | 7/2002 | Jaber | |
| 2006/0236182 A1* | 10/2006 | Xiang | G01R 31/318544 |
| | | | 714/734 |
| 2007/0273401 A1* | 11/2007 | Kiryu | G01R 31/318572 |
| | | | 326/16 |
| 2008/0235544 A1* | 9/2008 | Lai | G01R 31/318547 |
| | | | 714/729 |
| 2015/0169423 A1 | 6/2015 | Cook et al. | |

OTHER PUBLICATIONS

Li et al., "Logic BIST: State-of-the-Art and Open Problems", Mar. 16, 2015, 6 pages, <https://arxiv.org/pdf/1503.04628.pdf>.

Mahajan, Abhishek, "Improving fault coverage for random pattern-resistant designs", EDN Network, Dec. 3, 2015, 6 pages, <https://www.edn.com/design/integrated-circuit-design/4440967/Improving-fault-coverage-for-random-pattern-resistant-designs>.

Kusko et al., "Dynamic weight Selection Process for Logic Built-In Self Test", U.S. Appl. No. 16/693,426, filed Nov. 25, 2019, 59 pages.

IBM, "List of Patent Applications Treated as Related", Appendix P, Filed Herewith, 2 pages.

Ercolani et al., "Estimate of Signal Probability in Combinational Logic Networks", IEEE, 1989, pp. 132-138.

* cited by examiner

LOGIC BUILT-IN SELF TEST DYNAMIC WEIGHT SELECTION METHOD

BACKGROUND

The present invention relates generally to the field of integrated circuit testing, and more particularly to dynamic weight selection with respect to altering latch values in logic built in self test (LBIST) channels using weighted pseudo-random bit patterns.

A logic built-in self-test (LBIST) implemented on an integrated circuit (IC) enables the IC to test some or all of its logic circuits. A generic LBIST structure has per-channel weight selection capability. Pseudo-random patterns are fed as inputs to a logic circuit which is then clocked. The output response is then compared with an expected value.

SUMMARY

According to an aspect of the present invention, there is a method, computer program product and/or system that performs the following operations (not necessarily in the following order): (i) identifying a scan chain, of a logic circuit, of a semiconductor chip; (ii) generating a weighted bit chain for testing the scan chain, wherein the weighted bit chain is a pseudo-random sequence of bits, including a first pseudo-random bit, where a probability of the first pseudo-random bit is modified by a weighting factor; (iii) operating the semiconductor chip using the weighted bit chain as input to the scan chain; (iv) determining that a fault of the logic circuit has not been tested; (v) in response to determining that a fault of the logic circuit has not been tested, dynamically selecting a second weighting factor to generate an alternate weighted bit chain for testing the scan chain, where the probability of the first pseudo-random bit is modified by the second weighting factor; and (vi) operating the semiconductor chip using the alternate weighted bit chain as input to the scan chain.

DETAILED DESCRIPTION

Figure 1:
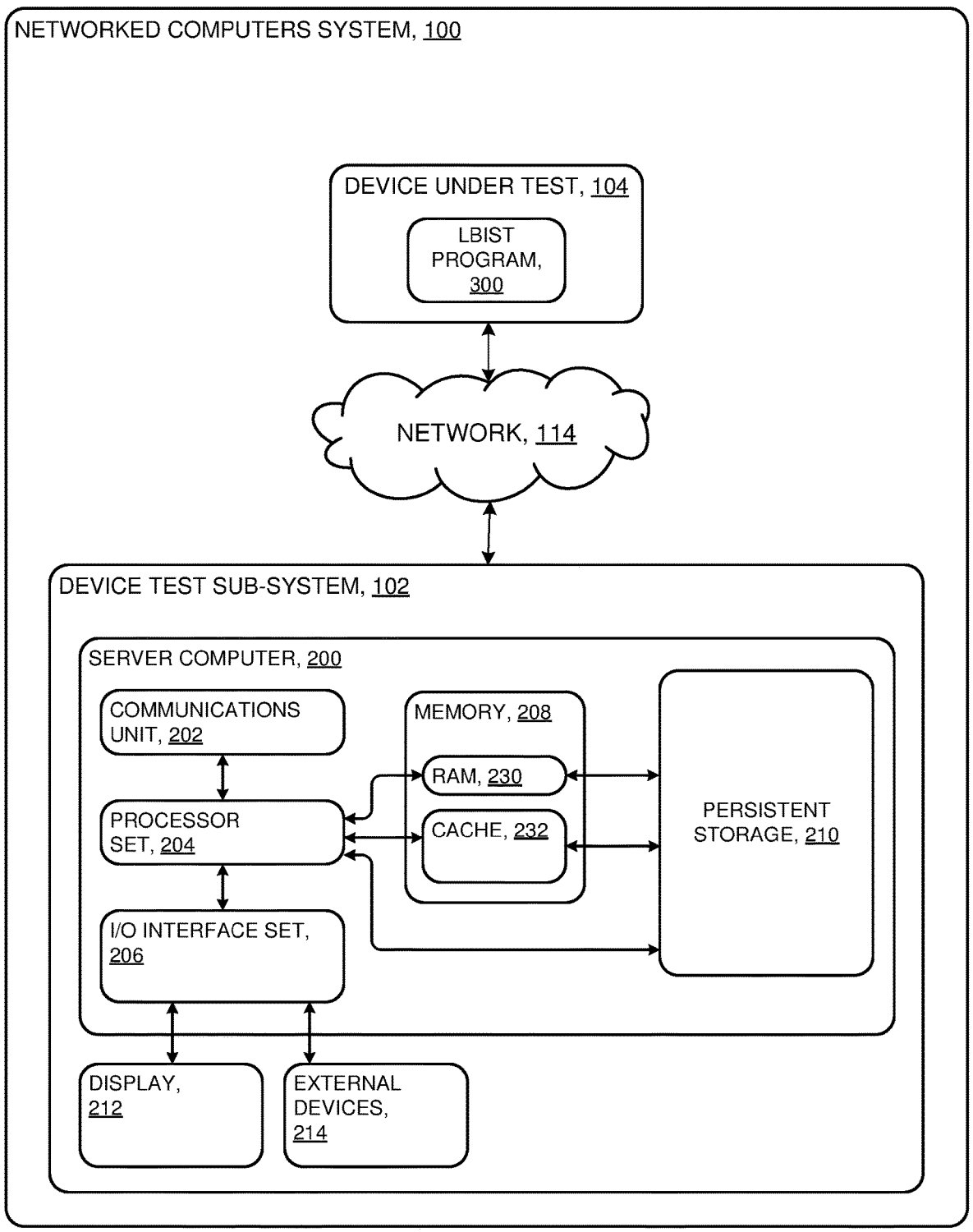
FIG. 1 is a block diagram showing a computing environment in accordance with at least one embodiment of the present invention.

Some embodiments of the present invention comprise a test method (including a self-test method) for testing a logical circuit of a semiconductor chip or other circuit device. The test method dynamically generates test patterns, including weighted random test patterns, for testing random pattern resistant faults, and un-modeled faults directed at specific logic groups, where the dynamically generated test pattern weights are configured to optimize test coverage and test time. The dynamically generated test patterns are based on factors related to random pattern resistant logic structures interconnected via scan chains. More particularly, the dynamically generated test patterns are designed to enable fault detection within logic structures that are resistant to fault detection when tested with random patterns. The test method determines a plurality of logic structures of the logic circuit, generates a weighted bit chain (a weighted, random sequence of bits, where the weighted bit chain is a pseudo-random sequence of bits where a probability of a given weighted pseudo-random bit is modified by a weighting factor that may be any value between 0 and 1 inclusive) for testing a subset of the logic structures, determines an alternate weighted bit chain for at least one logical chain, operates the semiconductor chip using the weighted bit chain and the alternate weighted bit chain, and uses a multiplexer located on the semiconductor chip to push either the weighted bit chain or the alternate bit chain onto respective logic structures of the logic circuit. The weighted bits are applied to latches in the scan chains. Scan chains are sometimes referred to as STUMP channels ("self test using MISRs and PRPGs"). Note: MISR="multiple input signature register" and PRPG="pseudo-random pattern generator".

Some embodiments provide several dynamic weight selection modes while executing a weighted pseudo-random sequence. Dynamic weight selection modes provide options to focus on application of weighted pseudo-random sequences, to provide test coverage for specific logic groups (sometimes herein referred to as logic modules, or logic structures), such as random resistant logic and unmodeled faults.

In some embodiments of the present invention, dynamic weight selection modes control the generation and application of weights by utilizing, individually and in various combinations, at least the following five methods: (i) dynamic and static weight selection; (ii) channel positional based weight selection; (iii) individual channel weights selection; (iv) dynamic latch position and latch range; and (v) force "0" and force "1" selection features.

Some embodiments implement the test method in various ways including: (i) during a verification phase (simulated and/or on physical hardware) of a circuit chip design (or logical sub-system(s) thereof); (ii) in manufacturing test operation(s) of prototype and/or production chips; (iii) at certain stages of chip operation such as during power on self-test of finished product in complete systems; and/or (iv) for stress testing and burn-in.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects may generally be referred to herein as a "circuit," "module", or "system." Furthermore, aspects of the present invention may take the form of a computer program product embodied in one or more computer readable medium(s) having computer readable program code/instructions embodied thereon.

This Detailed Description section is divided into the following sub-sections: (i) The Hardware and Software Environment; (ii) Example Embodiment; (iii) Further Comments and/or Embodiments; and (iii) Definitions.

The Hardware and Software Environment

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including: device test sub-system 102; device under test 104; communication network 114; server computer 200; communications unit 202; processor set 204; input/output (I/O) interface set 206; memory device 208; persistent storage device 210; display device 212; external devices 214; random access memory (RAM) 230; cache memory 232; and logic built-in self test program (LBIST program 300).

Device test sub-system 102 is, in many respects, representative of the various computer sub-system(s) in the present invention. Accordingly, several portions of device test sub-system 102 will now be discussed in the following paragraphs.

Device test sub-system 102 may be a laptop computer, tablet computer, netbook computer, personal computer (PC), a desktop computer, a personal digital assistant (PDA), a smart phone, or any programmable electronic device capable of communicating with the client sub-systems via communication network 114. LBIST program 300 is a collection of machine readable instructions and/or data that is used to create, manage, and control certain software functions that will be discussed in detail, below, in the Example Embodiment sub-section of this Detailed Description section.

Device test sub-system 102 is capable of communicating with other computer sub-systems via communication network 114. Communication network 114 can be, for example, a local area network (LAN), a wide area network (WAN) such as the Internet, or a combination of the two, and can include wired, wireless, or fiber optic connections. In general, communication network 114 can be any combination of connections and protocols that will support communications between server and client sub-systems.

Device test sub-system 102 is shown as a block diagram with many double arrows. These double arrows (no separate reference numerals) represent a communications fabric, which provides communications between various components of device test sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory device 208 and persistent storage device 210 are computer-readable storage media. In general, memory device 208 can include any suitable volatile or non-volatile computer-readable storage media. It is further noted that, now and/or in the near future: (i) external device(s) 214 may be able to supply, some or all, memory for device test sub-system 102; and/or (ii) devices external to device test sub-system 102 may be able to provide memory for device test sub-system 102.

In some embodiments, LBIST program 300 is integrated with device under test 104, and implemented as strictly hardware, strictly software, and/or a combination of hardware and software. In other embodiments, LBIST program 300 may be external to the device under test 104, such as in persistent storage device 210 of server computer 200, of device test sub-system 102.

In some embodiments, LBIST program 300 is stored in persistent storage device 210, of server computer 200, of device test sub-system 102, for access and/or execution by one or more of the respective computer processor set 204, usually through one or more memories of memory device 208. Persistent storage device 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage device 210.

LBIST program 300 may include both machine readable and performable instructions and/or substantive data (that is, the type of data stored in a database). In this particular embodiment, persistent storage device 210 includes a magnetic hard disk drive. To name some possible variations, persistent storage device 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage device 210 may also be removable. For example, a removable hard drive may be used for persistent storage device 210. Other examples include optical and magnetic disks, thumb drives, and smart cards that are inserted into a drive for transfer onto another computer-readable storage medium that is also part of persistent storage device 210.

Communications unit 202, in these examples, provides for communications with other data processing systems or devices external to device test sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external devices 214. External devices 214 will typically include devices such as a keyboard, keypad, a touch screen, and/or some other suitable input device. External devices 214 can also include portable computer-readable storage media such as, for example, thumb drives, portable optical or magnetic disks, and memory cards. Software and data used to practice embodiments of the present invention, for example, LBIST program 300, can be stored on such portable computer-readable storage media. In these embodiments, the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature, herein, is used merely for convenience, and, thus, the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Example Embodiment

Figure 2:
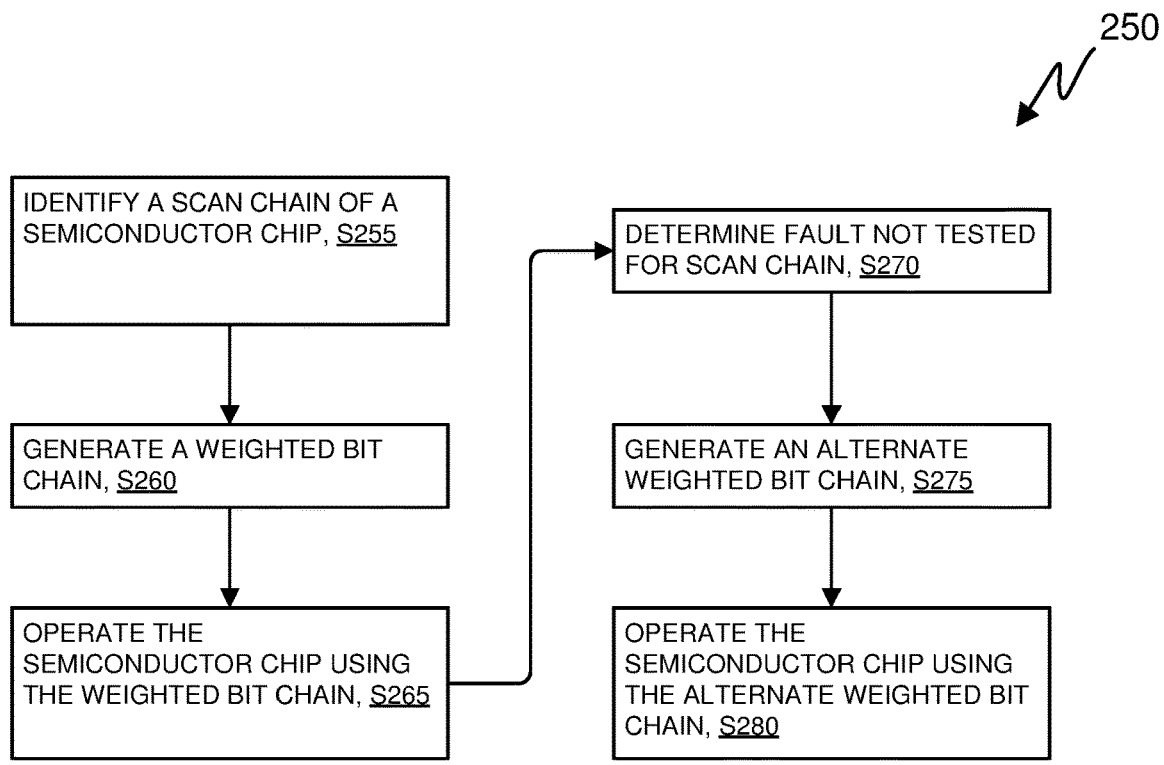
FIG. 2 is a flowchart showing a method performed, at least in part, in accordance with at least one embodiment of the present invention.
Figure 3:
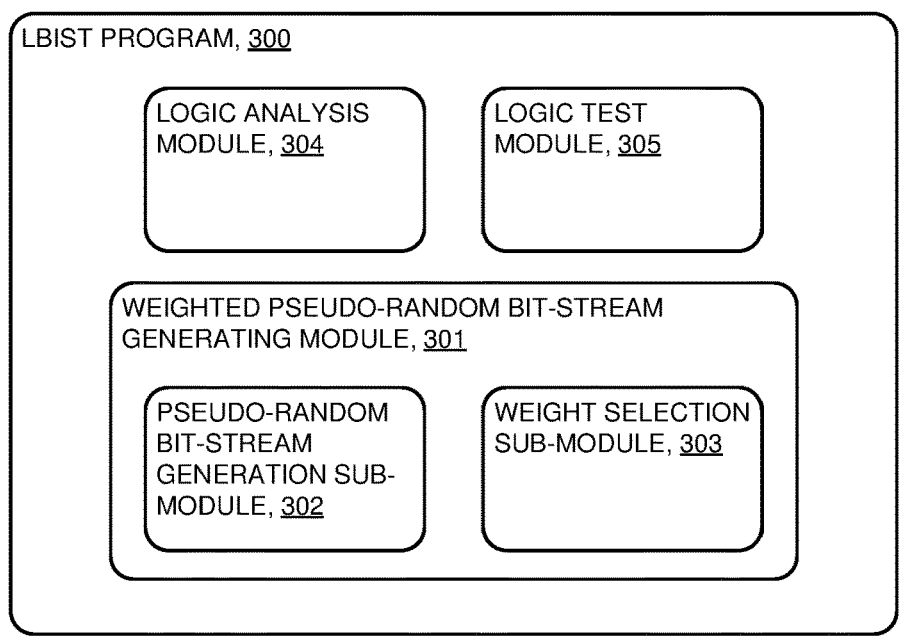
FIG. 3 is a block diagram showing a machine logic (for example, software and/or hardware) portion of a system in accordance with at least one embodiment of the present invention.

FIG. 2 shows flowchart 250 depicting a method according to the present invention. FIG. 3 shows LBIST program 300 for performing at least some of the method operations of flowchart 250. This method and associated software will now be discussed, over the course of the following paragraphs, with extensive reference to FIG. 2 (for the method operation blocks) and FIG. 3 (for the software blocks).

Processing begins at operation S255, where logic analysis module 304, of LBIST program 300, identifies at least one selected scan chain or STUMP channel, of a plurality of scan chains on a semiconductor chip, for logic built-in self-test (LBIST). In some embodiments, logic analysis module 304 identifies the scan chain (or channel) which controls and/or observes a logic network where resistance to pseudo-random fault detection exists. In other embodiments, logic analysis module 304 identifies the selected scan chain based primarily on logic design of the semiconductor chip, or on a particular area of the chip under study. Examples of random pattern resistant logic structures include decoders, equivalence checkers and comparators, to name a few. Note: the terms "scan chain", "channel" and "STUMP channel" are synonymous and herein used interchangeably.

"Scan-chains" comprise latches connected in serial when used during test. The term "logic" refers to elements which make up the function of the overall circuit, both in mission mode and in test mode. A subset of the logic is comprised of latches. In some embodiments of the present invention, a subset of latches are used in scan-chains.

Processing proceeds at operation S260, where weighted pseudo-random bit-stream generating module 301, of LBIST program 300 generates a first stream of weighted pseudo-random bits to be fed as input into the selected logic structure.

Processing proceeds at operation S265, where logic test module 305 tests the selected logic structure, using the first weighted pseudo-random bit-stream as inputs. Logic test module 305 observes output states resulting from multiple tests of the selected logic structure, where for each test, another set of weighted pseudo-random bits of the bit-stream are used as inputs. Logic test module 305 compares the output states of the logic structure to expected results, thus identifying any fault conditions.

In some embodiments, the first weighted bit-stream (sometimes herein referred to as a bit-chain) is based on a set of static weights.

Processing proceeds at operation S270, where logic test module 305 determines that an untested fault of the scan chain exists.

Processing proceeds at operation S275, where in response to determining that an untested fault of the scan chain exists, weighted pseudo-random bit-stream generating module 301 dynamically generates a second weighted pseudo-random bit-stream, based on a set of weights generated by weight selection sub-module 303. The second weighted bit chain is based on dynamic weights.

Processing proceeds at operation S280, where logic test module 305 tests the selected logic chain, using the second weighted pseudo-random bit-stream as input to the scan chain. Logic test module 305 observes output states resulting from multiple tests of the selected scan chain, where for each test, another set of weighted pseudo-random bits of the bit-stream is used as input. Logic test module 305 compares the output states of the scan chain to expected results, thus identifying any fault conditions.

In some embodiments, operations S270, S275, and S280 above are repeated until a stopping condition occurs, such as, without limitation: (i) the number of untested faults fails to decline at a pre-defined minimum rate with respect to the number of tests performed; (ii) the number of untested faults declines below a pre-defined threshold; (iii) resources (time, computing cycles, financial assets, etc.) expended in the testing exceeds a threshold; and/or (iv) costs associated with continued testing may exceed any corresponding projected benefits.

Dynamic weights may be modified at various times and in response to various conditions. For example, consider a scan chain for which logic test module 305 maintains a list of untested faults. Testing involves iterating through a large number of test cases where, in each test case, inputs to the scan chain are provided by the weighted pseudo-random bit-stream. If, for example, the scan chain has only four inputs, and each scan-chain is 4 bits long, then all possible input configurations can be exhaustively tested in 256 (that is $2^8$) iterations. However, in most practical embodiments, the scan chain may have dozens, hundreds, thousands, or even more inputs, and scan-chain lengths of hundreds or thousands of latches making it impractical to exhaustively test for each and every input configuration and/or fault condition. Therefore, the weighted pseudo-random bit-stream is used to extend the effectiveness of testing all (or a threshold probability of) possible fault conditions.

Logic analysis module 304 maintains a list of untested faults for the scan chain. As testing progresses, and certain faults have been tested, the list of untested faults shrinks. As testing progresses further, logic test module 305 determines that the weighting configuration of the weighted bit-stream is not leading to testing of the remaining untested faults. In response, weight selection sub-module 303 dynamically modifies the weighting configuration, based on the test results, such that subsequent iterations are more likely to test the remaining untested faults.

In some embodiments of the present invention, pseudo-random bit-stream generation sub-module 302, of weighted pseudo-random bit-stream generating module 301, of LBIST program 300, generates a pseudo-random bit pattern having properties whereby a default probability that any given bit is equal to "1" is 0.5 (P{"1"}=½) at each generation cycle. This aspect (P{"1"}=½ for each bit) is a desirable base characteristic of random-pattern generators, such as certain linear feedback shift registers.

In some embodiments, weight selection sub-module 303, of weighted pseudo-random bit-stream generating module 301, applies, to a predetermined subset of bits of the pseudo-random bit pattern, a logical operation, to generate a weighted bit. In some embodiments, the logical operation is a logical AND. By ANDing together two bits from the pseudo-random bit pattern, the resultant bit is a weighted bit having a probability of ¼ (P{"1"}=¼), that is ½×½=¼. By ANDing together three bits from the pseudo-random bit pattern, the resultant bit is a weighted bit having a probability of ⅛ (P{"1"}=⅛), that is ½×½×½=⅛. In general ANDing together n bits from the pseudo-random bit pattern, where each bit of the pseudo-random bit pattern has a default probability, produces a weighted bit having a probability equal to the default probability raised to the power n. That is P{"1" }=[default probability]$^n$.

In some embodiments, weights greater than the default probability are generated by ANDing a number of bits and taking the inverse, by applying a logical NOT operation. Alternately, some embodiments use a logical OR operation to generate the opposite weight state. This produces the complement of the weighted bit where "0" flips to "1" and "1" flips to "0". Thus, by ANDing together three bits (P{"1"}=⅛) for example, and taking the inverse, a resultant weighted bit has a ⅞ probability of being a logical "1" (P{"1"}=⅞).

In some embodiments of the present invention, LBIST program 300 applies the weighted bit to a latch position, within a channel of a logic processing module, to enhance test coverage performed by the logical built-in self test.

A "channel", as it relates to LBIST and described herein, is a "scan-chain" comprising a plurality of serially connected latches. The latches are used functionally in mission mode and in testing with structural configurations such as level sensitive scan design (LSSD), general scan design (GSD), LBIST, automatic built-in self test (ABIST), etc. At least one embodiment, during testing, accesses the scan chain or loads the scan chain serially via a scan register input (SRI) pin and unloads it serially via a scan register output (SRO) pin. Some embodiments stimulate the LBIST configuration SRIs with a pseudo-random pattern generator (PRPG), while the output SROs are observed via the multiple input signature register (MISR). In some embodiments, scan chains or channels are also sometimes referred to as "self test using MISRs and PRPGs" (STUMP) channels.

In some embodiments, a LBIST instance comprises 32 channels, a PRPG and an MISR. Channel lengths can range from a few latches to thousands of latches depending on specific design characteristics and LBIST configuration. A device (a processor chip, for example) may incorporate multiple LBIST instances, where some LBIST instances are similar copies of each other (COREs, for example), while other instances may be completely different from one another (for example, NEST, PCI, etc.). Some embodiments apply LBIST to: (i) an array (such as a memory array); and/or (ii) a region of "random logic".

The terms "CORE", "NEST", and "PCI" appearing in the previous paragraph will now be expanded upon. In some embodiments, the term "CORE" refers to any of the following (without limitation): (i) a function (for instance a high speed serial link); and/or (ii) a block of intellectual property (IP block) which may be used within a larger design. The term "NEST" refers to logical circuitry which supports one or more COREs (IP blocks). In some embodiments, NEST supports reliability and serviceability functions for the supported circuitry. In some embodiments, NEST has a communications port which can be used to control NEST features and to program and/or observe IP blocks over an address mapped serial or parallel data bus. Peripheral component interconnect (PCI) herein refers to any type of serial and/or parallel port protocol.

In some embodiments, a PRPG is a linear feedback shift register (LFSR) comprising a set of serially connected latches where certain latch outputs are fed back to certain latch inputs through respectively corresponding exclusive OR (XOR) gates.

Further Comments and/or Embodiments

Some embodiments of the present invention maintain the compression and "built-in" advantages of logical built-in self test (LBIST), yet also support dynamic weight selection fault targeting.

Some embodiments of the present invention recognize the following facts, potential problems and/or potential areas for improvement with respect to the current state of the art: (i) some conventional weighted (test) pattern approaches require multiple logical built in self-test (LBIST) pattern sequences with different weight setups to test small subsets of random resistant faults; (ii) a lack of granularity of weighted pattern LBIST control drives a need for generating focused fault automated test patterns (ATPGs) to test untested faults and achieve desired test coverage; (iii) for some basic LBIST patterns, additional sets of weighted LBIST patterns and supplemental ATPG patterns result in excessive test times and large test pattern data volume requirements; and/or (iv) some conventional LBIST methods comprise applying a large number of pseudo-random patterns to a device-under-test (DUT)—however, some logic circuits, by nature (for example decoders, equivalence checkers and comparators, to name a few), are resistant to this pseudo-random approach (random resistant).

In general throughout this disclosure, discussion considers a 32 channel embodiment. It is to be understood that some embodiments of the present invention implement other channel configurations, such as 16 channel embodiments and 64 channel embodiments, to name just two, of many possible examples.

In some embodiments, a new LBIST feature provides several dynamic weight selection modes while executing a weighted pseudo-random sequence (see FIG. 7 below). These new dynamic weight selection modes provide options whereby focus can be directed to the application of weighted pseudo-random sequences to provide test coverage for specific logic groups (sometimes herein referred to as logic modules), such as random resistant logic and unmodeled faults.

In some embodiments of the present invention, dynamic weight selection modes control the generation and application of weights by utilizing, individually and in various combinations, at least the following five methods: (i) dynamic and static weight selection; (ii) channel positional based weight selection; (iii) individual channel weights selection; (iv) dynamic latch position and latch range; and (v) force "0" and force "1" selection feature.

In some embodiments of the present invention, dynamic weight selections modes discussed in the paragraph above, generate (at least) the following weighted patterns: (i) static weight selection per STUMP (self test using multiple input signature registers (MISRs), pseudo-random pattern generators (PRPGs), and parallel shift register sequence generators (SRSGs)) channel; (ii) dynamic weight selection per channel and/or per latch selection; (iii) any combination of channel per dynamic weight; (iv) multiple latch positions support; and/or (v) 'hold' dynamic channel/weight for a range of latch positions.

Some embodiments of the present invention may include one, or more, of the following features, characteristics, and/or advantages: (i) selectable weight for each latch, latch-range and per scan channel, LBIST pattern concept; (ii) dynamic weight selection; (iii) extreme 'weights' selection (force "0", force "1"); (iv) built-in automated test pattern generation (ATPG); (v) integrated comprehensive LBIST method; (vi) test time, data volume and overall test cost reduction; (vii) enhanced test pattern generation process; (viii) improved test coverage and consequently improved shipped product quality level (SPQL); and/or (ix) new built-in ATPG capability.

Figure 4:
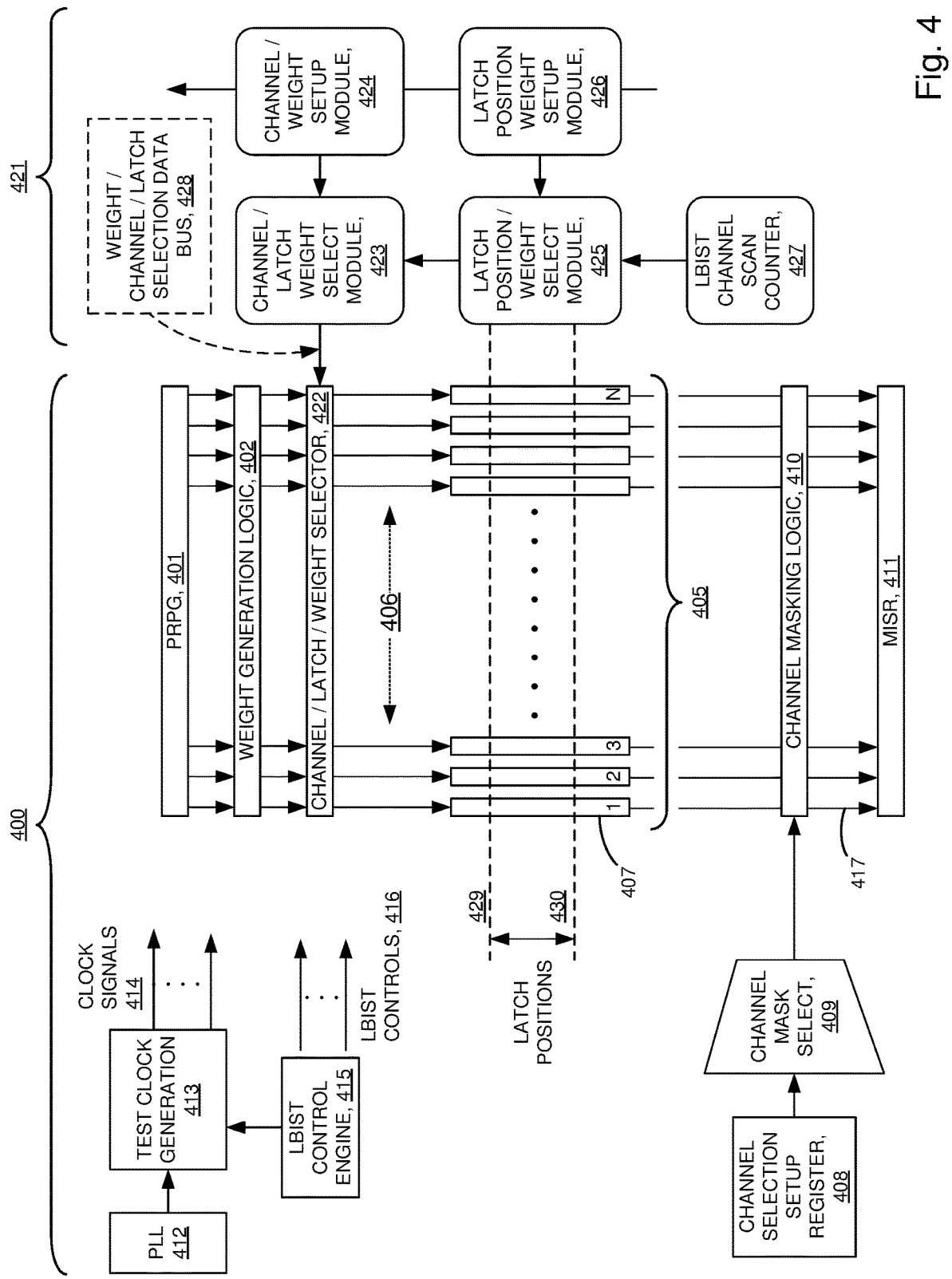
FIG. 4 is a block diagram showing a logical built-in self test dynamic weighted selection in accordance with at least one embodiment of the present invention.

FIG. 4 is a block diagram showing a LBIST dynamic weight selection concept in accordance with some embodiments of the present invention. FIG. 4 includes base LBIST structure section 400, and dynamic weight setup and selection control 421.

Base LBIST structure section 400, of FIG. 4, includes: pseudo-random pattern generator, PRPG 401; weight generation logic 402; (32-channel) chain configuration 405; weighted pseudo-random stream bits 406; LBIST channel 407 (sometimes herein referred to as "STUMP chains"); channel selection setup register 408; channel mask select 409; channel masking logic 410 (channel selector); multiple input signature register, MISR 411; phase locked loop, PLL 412; test clock generation 413; clock signals 414; LBIST control engine 415; clocks and controls distribution 416; and/or MISR output signature 417. Some embodiments implement multiple instances of this configuration (base LBIST structure section 400) in a device under test (DUT).

Dynamic weight setup and selection control 421, of FIG. 4, includes: channel/latch/weight selector 422; channel/latch weight select module 423; channel/weight setup module 424; latch position/weight select module 425; latch position weight setup module 426; LBIST channel scan counter 427; weight/channel/latch selection data bus 428; latch range top 429; and/or latch range bottom 430. Some embodiments implement multiple instances of this configuration (dynamic weight setup and selection control 421) in a DUT.

In some embodiments of the present invention, pseudo-random pattern generator (PRPG 401) is implemented as a linear feedback shift register (LFSR). PRPG 401 and/or an LFSR may be 32-bits in length, and configured with feedback taps to generate 'maximal' length states (that is, $2^n-1$ possible states, where n is the LFSR bit or latch length). While the Figures show an N-STUMP chain configuration LBIST structure (where N=32 channels in some embodiments), some embodiments of the present invention apply to smaller or larger configurations as well. In some embodiments, PRPG 401 comprises multiple pseudo-random pattern generator instances (and/or multiple instances of LFSR). For simplicity and convenience in description, the multiple instances of PRPG 401 (and LFSR), collectively, will be referred to in the singular.

In some embodiments of the present invention, weight generation logic 402 (sometimes herein referred to as a "spreading network") is shared for multiple instances of LBIST channel chain configuration 405. Weight generation logic 402 generates a set of selectable weights that are based on the pseudo-random probability of ½ (equal probability of "0" or "1" state) for each PRPG latch. The output from weight generation logic 402 comprises weighted output bit 509 (see FIG. 5)

Figure 6:
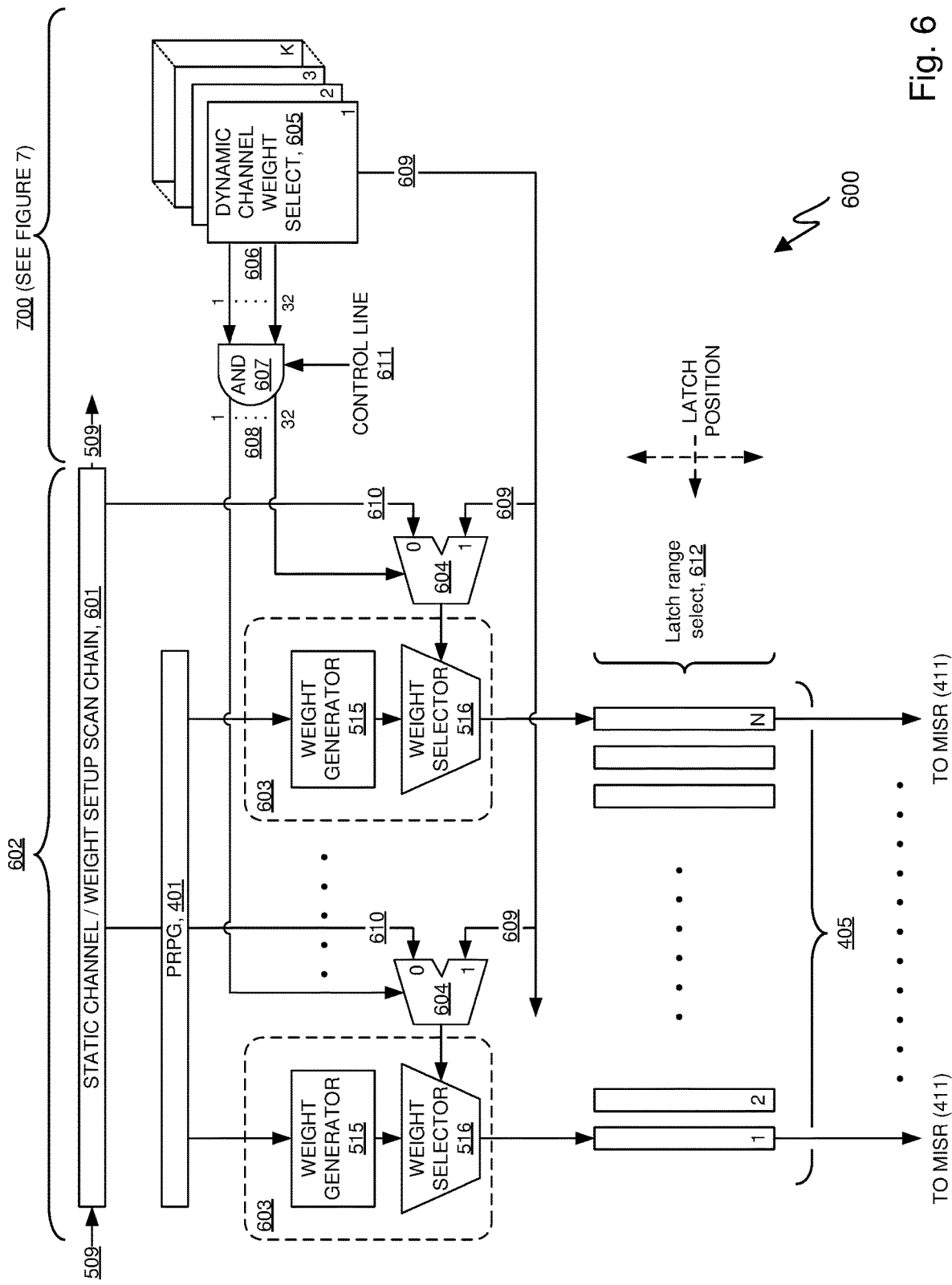
FIG. 6 is a block diagram showing a static and dynamic individual stump chain weight generation and selection module in accordance with at least one embodiment of the present invention.

Chain configuration 405 represents N channels comprising system latches and combinational logic to be tested by the execution of multiple LBIST tester loops and test sequences. Although the figures show the multiple instances of LBIST channel 407 chains (STUMP chains) as having the same length, some embodiments have fewer or more chains of equal and/or unequal lengths. Further, while FIGS. 4, 6, and 7 show N instances of LBIST channel 407, where for discussion herein, N=32, some embodiments have other numbers of instances of STUMP channel 407 (for example, 16, 64, or any other number of instances). However, the number of channels (N) and length of each channel may vary from embodiment to embodiment. STUMP chains are formed by concatenating functional latches in a serial scan chain, whereas in mission mode, and functional mode, the latches are clocked and loaded via a broadside port.

In some embodiments of the present invention, weight generation logic 402 serially shifts or loads weighted pseudo-random stream bits 406 into each respective chain, one bit at a time. This loading shift process is repeated for the length of the longest channel, until all latches in chain configuration 405 structure are loaded. LBIST channel 407 similarly unloads the selected channels at the output end. Contents of the latches are clocked into the MISR via mask select 409 to generate a signature.

In some embodiments of the present invention, channel selection setup register 408, sets up individual channel selections. Different channel selections may be loaded for multiple execution passes of the logic test.

In some embodiments of the present invention, channel mask select 409 receives, for a given logic test, channel mask register contents from channel selection setup register 408, and applies the register contents to mask or disable the scan output of specific channels.

In some embodiments of the present invention, channel masking logic 410 implements each channel's respective masking logic in accordance with the channel masking determined by channel selection setup register 408 and controlled by channel mask select 409.

In some embodiments of the present invention, multiple input signature register, MISR 411, is similar to LFSR (and PRPG 401) but adds exclusively ORed (XORed) inputs for each latch position. Output from each selected LBIST channel 407 feeds into a respectively corresponding MISR 411 input. MISR 411 compresses large numbers of bits generated during the LBIST test, to produce MISR output signature 417. MISR 411 unloads MISR output signature 417, whereupon the LBIST test system compares MISR output signature 417 to an expected signature. In some embodiments, MISR 411 comprises multiple "multiple input signature register" instances. For simplicity and convenience in description, the multiple instances of MISR 411, collectively, will herein be referred to in the singular.

In some embodiments of the present invention, phase lock loop, PLL 412, is part of the system clock generation function. PLL 412 generates internal high frequency functional clocks based on externally supplied reference clocks.

In some embodiments of the present invention, test clock generation 413 generates system functional and clock signals 414 based on input received from PLL 412. System functional and clock signals 414 include support for LBIST clocking and associated scan clocks (system and scan clocks).

In some embodiments of the present invention, LBIST control engine 415 controls sequencing, loop control and execution of PRPG 401, MISR 411, and channel scan and control of the test logic. Further, LBIST control engine 415 controls LBIST channel scan counter 427. LBIST control engine 415 supports one or more channel structures concurrently. Further, LBIST control engine 415 performs clocks and controls distribution 416 throughout the structure of FIG. 4.

Structures and components that enable dynamic weight selection, and apply selected weights to the generation of the pseudo-random bit streams, which in turn are applied to the scan channels in the LBIST configuration include: (i) channel/latch weight select module 423 (channel-latch-weight modes); (ii) channel/weight setup module 424; (iii) latch position/weight select module 425; and (iv) latch position weight setup module 426.

Dynamic weight setup and selection control 421 comprises channel/latch weight select module 423, and channel/weight setup module 424. Dynamic weight setup and selection control 421 sets up and controls the dynamic weight selection modes described below.

Channel/latch/weight selector 422 dynamically selects one of the weighted bits for each channel on every scan cycle. Channel/latch/weight selector 422 is an extension of dynamic weight setup and selection control 421, both enabling the select function. Channel/latch weight select module 423 generates weight/channel/latch selection data bus 428 for each channel on every scan cycle, based on a combination of data generated by: (i) channel/weight setup module 424; and (ii) latch position weight setup module 426. In some embodiments, weight/channel/latch selection data bus 428 is 3-bits wide. In some embodiments, the selection data has other bit widths (for example, 4-bits wide).

Channel/weight setup module 424 is a set of one or more registers, preloaded with channel/weight setup data. Some embodiments implement other forms of storage and selection of the channel/weight setup data, such as register arrays, scan chains, etc.

Latch position/weight select module 425 enables dynamic latch select mode, and provides latch specific position comparison setup data. Function enablement for a specific latch select instance is accomplished by comparing the setup data to the existing LBIST channel scan counter. Additional details of this function is described below with respect to FIG. 6.

Latch position weight setup module 426 is a set of one or more registers, preloaded with latch position setup data. Some embodiments implement other forms of storage and selection of the latch position setup data, such as register arrays, scan chains, etc.

LBIST channel scan counter 427 cycles scans (load and unload) concurrently for all the channels. LBIST channel scan counter 427 cycles the counter based on the longest channel length, and is controlled by LBIST control engine 415.

Weight/channel/latch selection data bus 428, carries data generated by channel/latch weight select module 423, to channel/latch/weight selector 422.

Latch range top 429 depicts one of many possible latch position match points. Latch range bottom 430 depicts another one of many possible latch position match points. Each latch position match point extends from the first latch in a channel to the last latch in the longest channel.

Alternatively, in some embodiments, latch range top 429, together with latch range bottom 430, respectively define the top and bottom ends of a selected, contiguous set of latch position match points. Latch range may be inclusive or exclusive.

Figure 5:
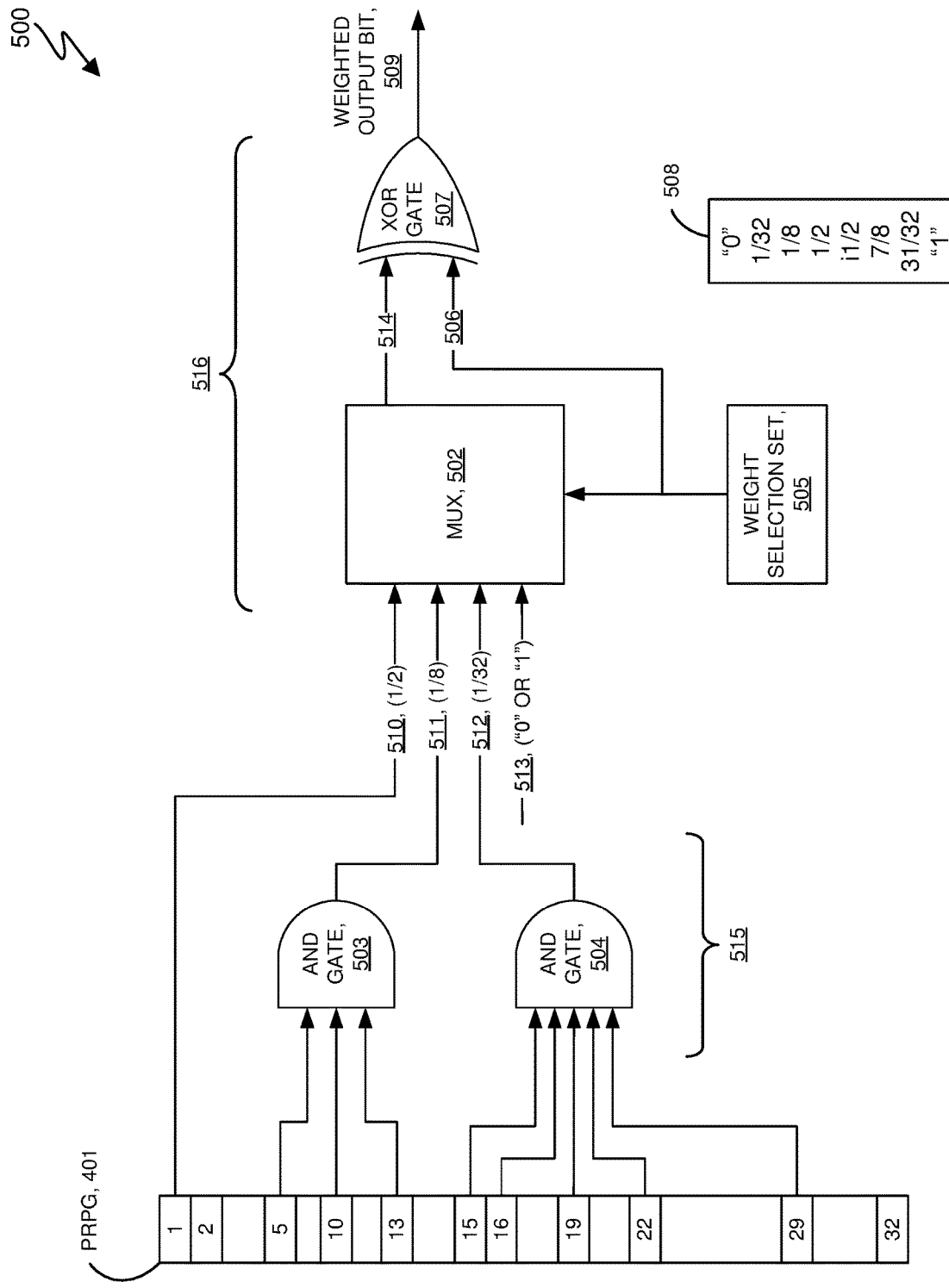
FIG. 5 is a logic diagram showing a weight generation and selection method in accordance with at least one embodiment of the present invention.

Logic diagram 500 of FIG. 5 shows a weight generation and selection method in accordance with at least one embodiment of the present invention. Logic diagram 500 includes: PRPG 401 (see FIG. 4), a pseudo-random pattern generator (such as, for example, a linear feedback shift register); weight selection multiplexer 502; AND gates 503 and 504; weight selection set 505; inversion bit 506; and/or XOR gate 507.

Weight generator 515 comprises AND gate 503, and AND gate 504. Weight selector 516 comprises weight selection multiplexer 502, weight selection set 505, and XOR gate 507. Weight generation logic 402 (see FIG. 4) comprises the combination of weight generator 515 and weight selector 516.

PRPG 401 receives an initializing seed, and generates a series of pseudo-random outputs which feed, as inputs, into the remainder of logic diagram 500. Output generated by logic diagram 500 includes weighted output bit 509.

PRPG 401 is shown as a 32-bit pseudo-random pattern generator, configured to maximal length. In some embodiments, PRPG 401 is configured to other lengths. Feedback taps are not shown.

Some embodiments generate a weight set based, at least in part, on: (i) individual bit values tapped from PRPG 401; and (ii) a selection multiplexer for selecting a specific weight out of the set. Some embodiments generate complement probability weights using an exclusive OR (XOR) inversion method. Some embodiments include ability to force weights of "0" and/or "1" in dynamically generating the weight set.

Some embodiments of the present invention generate the weights as follows:

PRPG 401 generates a pseudo-random pattern where the probability that any given bit is "1" is ½. That is, $P\{"1"\}=½$.

In the embodiment of FIG. 5, bit 1 of PRPG 401 is tapped as input 510 (although any bit would serve the same purpose) feeding into weight selection multiplexer 502.

In the embodiment of FIG. 5, three bits (positions 5, 10, and 13) are tapped as inputs feeding into AND gate 503. Output from AND gate 503 feeds into weight selection multiplexer 502 as input 511. Any combination of three bits would serve the same purpose (a bit with ⅛ probability $P\{"1"\}=⅛$, and $P\{"0"\}=⅞$). The output of AND gate 503 (input 511) therefore is "1" only if all three bits (5, 10, and 13) are "1".

In the embodiment of FIG. 5, five bits (positions 15, 16, 19, 22, and 29) are tapped as inputs feeding into AND gate 504. Output from AND gate 504 feeds into weight selection multiplexer 502 as input 512. Any combination of five bits would serve the same purpose (a bit with 1/32 probability $P\{"1"\}=1/32$, and $P\{"0"\}=31/32$). The output of AND gate 504 (input 512) therefore is "1" only if all five of bits (15, 16, 19, 22, and 29) are "1".

Alternatively, in some embodiments, PRPG 401 is designed to generate a pseudo-random pattern where the probability of any given bit being "1" is not ½, but rather a different probability, such as ⅓ for example. In such an embodiment: $P\{"1"\}=⅓$ for input 510; $P\{"1"\}=1/27$ for input 511 and $P\{"1"\}=1/243$ for input 512.

In another alternative embodiment, PRPG 401 is designed to generate bit patterns where each bit has an independent, arbitrary probability of being equal to "1". For example, for each bit in odd positions (1, 3, 5 . . . ), $P\{"1"\}=⅓$ and for each bit in even positions, (2, 4, 6 . . . ), $P\{"1"\}=⅕$. Generally, PRPG 401 can be configured in many ways while remaining within the scope and spirit of the present invention.

In some embodiments, weight selection multiplexer 502 has four inputs as follows: input 510, which has a probability of ½; input 511, which has a probability of ⅛; input 512, which has a probability of 1/32; and input 513, which is a forced "0" in some embodiments, or forced "1" in some embodiments. In some embodiments, weight selection multiplexer 502 has fewer, or more inputs, each having various probabilities determined by the configuration of PRPG 401 and configuration of bits tapped therefrom.

Weight selection multiplexer 502 produces output 514 which is selected from the four inputs (510, 511, 512 and 513) according to weight selection set 505. Weight selection set 505 comprises three bits ($\log_2(8)$=3): two bits are used for selecting one of the four inputs (510, 511, 512, and 513), and inversion bit 506. XOR gate 507 takes input from output 514 and inversion bit 506. If inversion bit 506 is "0", weighted output bit 509 is equal to output 514. If inversion bit 506 is "1", weighted output bit 509 is the complement (logical negation) of output 514. Weighted output bit 509 therefore is a single bit output stream with selected pseudo-random probability statistics.

List 508 shows all eight P{"1"} weights that are selectable by the three bits of weight selection set 505 in the embodiment of FIG. 5. In some embodiments that produce more than eight selectable weights, weight selection set 505 has a correspondingly greater number of bits. For example, for 16 selectable weights, weight selection set 505 has four bits ($\log_2(16)$=4). In general, for n selectable weights, weight selection set 505 has at least $\log_2(n)$ bits.

Either or both of the ½ and i½ can be used. The "i½" term is the inverse (complement) of the "½" term. Both ½ and i½ have the same probability distribution.

Block diagram 600, of FIG. 6, shows an overview of the static and dynamic weight and channel selection concept (static and dynamic individual STUMP chain weight selection) in accordance with some embodiments of the present invention. Block diagram 600 shows additional detail with respect to functions of the "dynamic weighted selection concept" embodied as channel/latch weight select module 423, and weight generation logic 402 (see FIG. 4). Reference to section 602 is made in FIG. 7.

Static channel/weight setup scan chain 601, performs individual channel weight selection. Some embodiments use other forms of storage and selection of the setup data, such as register arrays, etc. A stream of bits (weighted output bit 509, see FIG. 5) feeds into static channel/weight setup scan chain 601.

Weight generation and selection 603 comprises, for example, three bits for each channel (channel 1 through channel/V, inclusive).

Weight generation and selection 603 comprises weight generator 515 and weight selector 516 (see FIG. 5). Weight generation and selection 603 is replicated for each channel, allowing for independent weight selection for each channel.

Static/dynamic select multiplexer 604 allows either the static (610) or dynamic (609) weight selection for each channel, based on respective output lines 608 from Dynamic AND gate 607.

Dynamic channel weight select 605 is a set of registers (1-K) that are loaded with dynamic channel/weight selection data. Dynamic channel weight select 605 are further expanded and described below, with respect to FIG. 7. Some embodiments of the present invention implement other forms of storage and selection of the setup data, such as for example, register arrays, etc.

Register bus 606 comprises data from dynamic channel weight select 605, intended to dynamically select one or more channels in conjunction with individual channel weight selections.

Dynamic AND gate 607 passes along dynamic weight selection based in part on the state of control line 611.

Dynamic AND gate 607 has 32 (for example, for N=32) output lines 608. When control line 611 disables dynamic AND gate 607, all 32 output lines 608 are "0". When control line 611 enables dynamic AND gate 607, the 32 output lines 608 are driven by data put on register bus 606 by dynamic channel weight select 605. In other words, when control line 611 does not assert "enable", all channel weight selections are static. When control line 611 asserts "enable" (this is dynamic weight select mode), weight select is applied concurrently to any combination of the 32 STUMP chains.

Each line, of output lines 608, selects either the static or dynamic weight for each individual channel. The static weight is selected when the individual output is "0". Note that when control line 611 disables dynamic AND gate 607, all channels select the default static weights as derived from static channel/weight setup scan chain 601.

In some embodiments, dynamic weight select bus 609, and static weight select bus 610 each comprise 3-bits.

Latch range select 612 represents the range of latches that can be selected, which encompasses all the latch positions for the longest scan channel.

Figure 7:
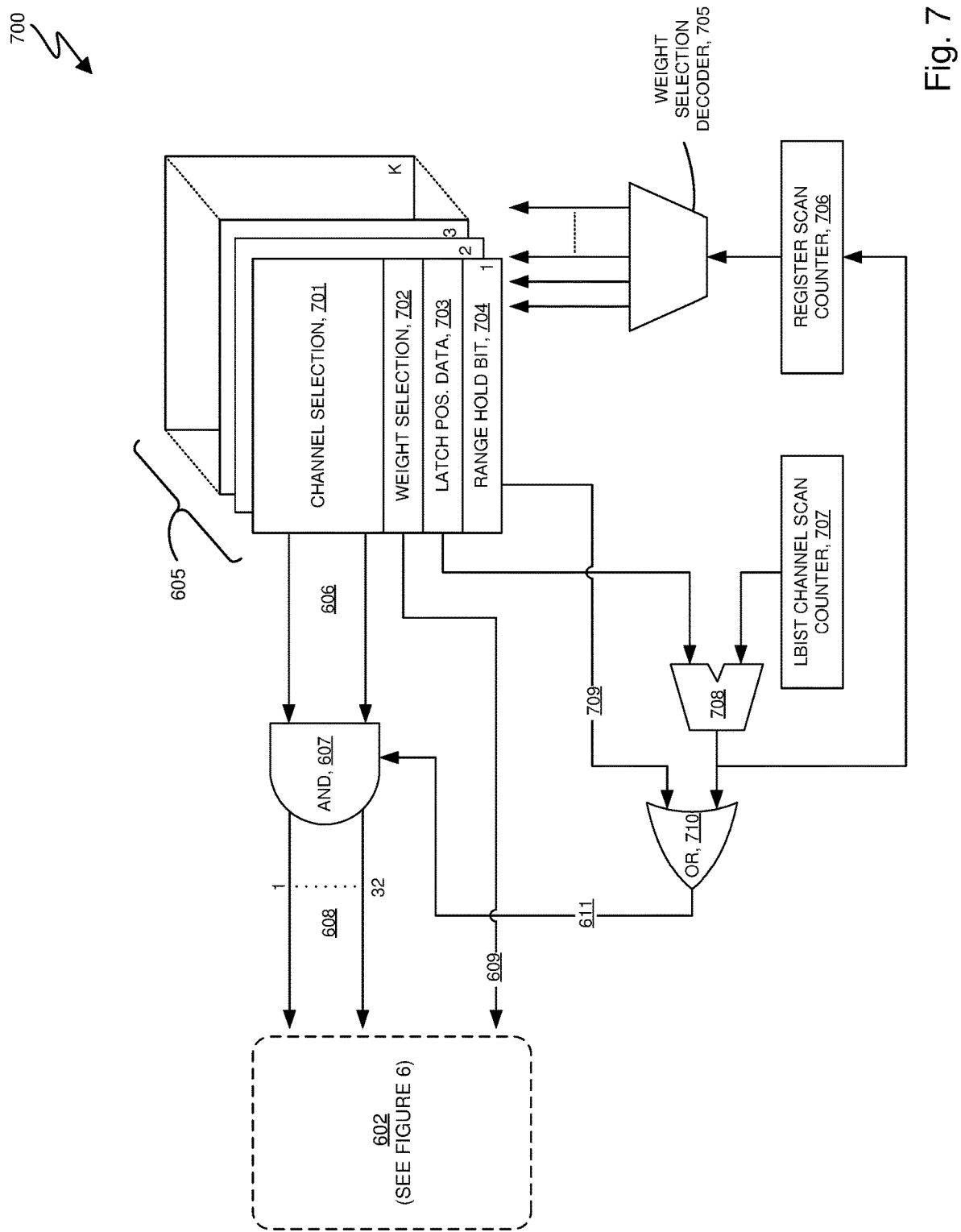
FIG. 7 is a block diagram showing stump chain latch position dynamic weight assignment in accordance with at least one embodiment of the present invention.

Block diagram 700 of FIG. 7 provides an overview of a dynamic weight selection concept (STUMP chain latch position dynamic weight assignment) in accordance with some embodiments of the present invention. Note: FIG. 7 is an extension of the weight select function of FIG. 6. Block diagram 700 shows a composite configuration for dynamic weight assignment, including: dynamic channel weight select 605; channel selection data 701; weight selection data 702; latch position data 703; range hold bit 704; weight selection decoder 705; register scan counter 706; LBIST channel scan counter 707; comparator 708; hold latch 709, scan cycle select OR gate 710; and control line 611. Control line 611 controls (turns on or off) dynamic enable mode. Control line 611 is sometimes herein referred to as "dynamic weight select mode enable".

Dynamic channel weight select 605 is a set of registers (1-K) loaded with the dynamic channel/weight/latch/hold selection data (sometimes herein referred to as setup data), discussed above with respect to FIG. 6. The data held in the registers comprises: latch data comprising channel selection data 701 (32 latches for channel selection); weight selection data 702 (3 latches for weight selection); latch position data 703; and range hold bit 704. As mentioned above with respect to FIG. 6, some embodiments of the present invention implement other forms of storage and selection of the setup data, such as for example, register arrays, etc. Further, the numbers of latches (32 for channel selection and 3 for weight selection) discussed above, may vary in some embodiments of the present invention.

The latch position data 703 portion of the register provides for latch position selection. The number of latches required for dynamic weight assignment mode, in some embodiments, is equal to the LBIST channel scan counter 707. For example, if the longest chain is 1024, then 10 latches are required. (that is $2^{10}$=1024).

Hold-bit 704 sets a "hold" weight selection for an extended range of scan cycles. When hold-bit 704 is set, and the latch position matches the channel scan cycle, then hold latch 709 is set, and maintained in the "set" state, until it is reset in response to encountering the next matching condition while hold-bit 704 is in the reset state (not set).

Weight selection decoder 705 selects and enables dynamic weight selection from a specific register of dynamic channel weight select 605.

Register scan counter 706 sequences through dynamic channel weight select 605. Register scan counter 706 resets at the start of a channel scan cycle, and increments after each latch position data 703 and LBIST channel scan counter 707 compare match.

LBIST channel scan counter 707 cycles through scans (load and unload) concurrently for all channels. In some embodiments, LBIST channel scan counter 707 cycles for the longest channel length and is controlled by LBIST control engine 415.

Comparator 708 compares LBIST channel scan counter 707 with the latch position data 703 (from dynamic channel weight select 605). In response to encountering a match, comparator 708 sets control line 611, and increments register scan counter 706 to select the next dynamic channel weight latch register.

Hold latch 709 mirrors (in other words, is controlled by) the state of hold-bit 704.

Scan cycle select OR gate 710 selects a single scan cycle or a cycle range dynamic weight select mode, depending on the respective states of hold latch 709 and output from comparator 708. The output of scan cycle select OR gate 710 is control line 611.

Multiple instances of the configuration shown in block diagram 700 may be implemented on a circuit device under test (DUT). In some embodiments, each instance is independent of any other instances, even though certain resources may be shared among the instances. Shared resources among instances may include: (i) LBIST control engine 415 (see FIG. 4); (ii) timing generation; (iii) pseudo-random pattern and weights generation; and/or (iv) weight selection functions.

Figure 8:
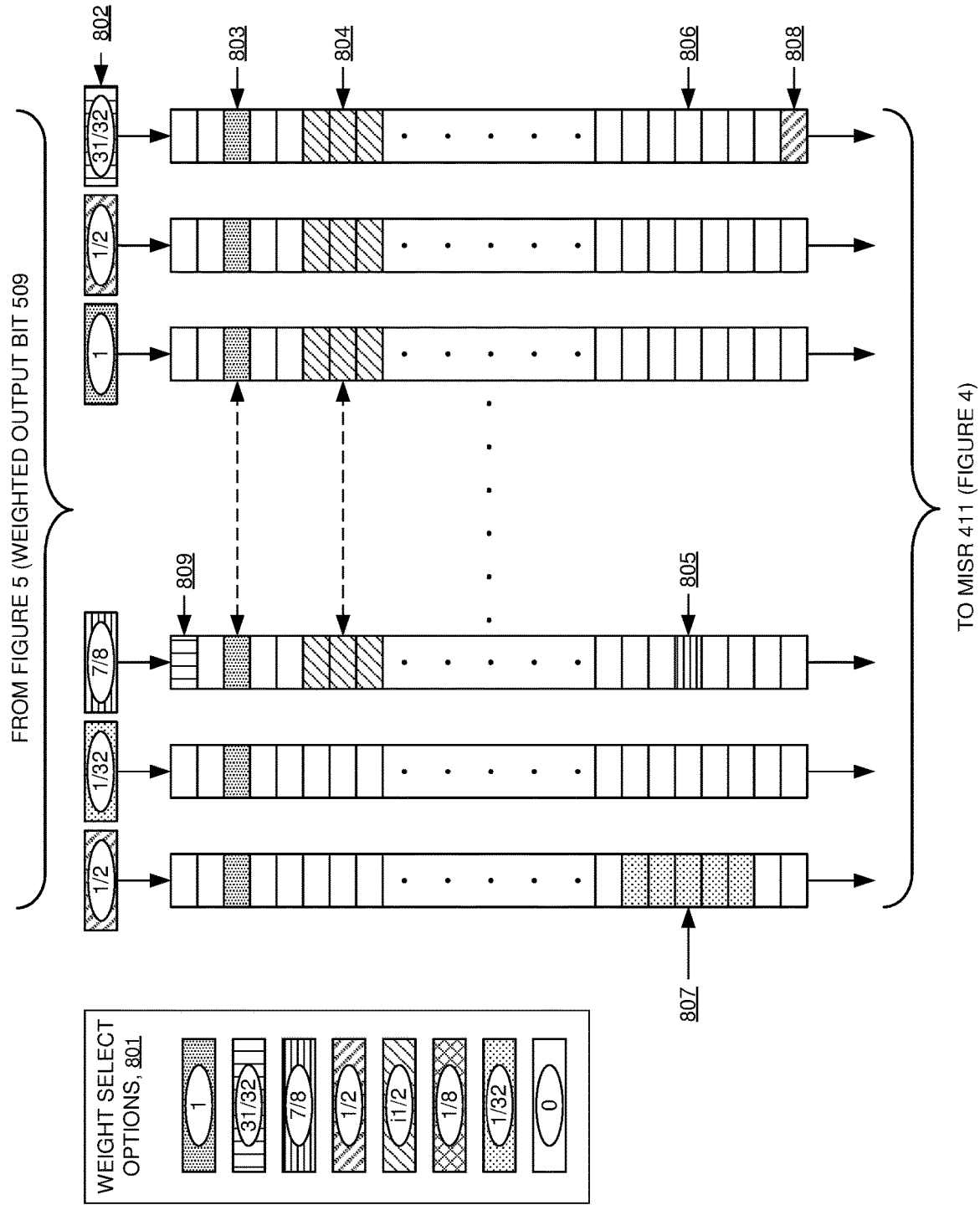
FIG. 8 is a block diagram showing static and dynamic weight selection example in accordance with at least one embodiment of the present invention.

Block diagram 800 of FIG. 8 shows an example of static and dynamic weight selection in accordance with some embodiments of the present invention. Block diagram 800 shows different example weight assignment options available in some embodiments with the dynamic selection modes, including instances of weight allocation to scan chains and specific latches or range of latches. In some embodiments, the options are further expanded in accordance with specific LBIST designs and configurations.

Block diagram 800 (showing an overview of some possible dynamic weight to latch assignments) includes: weight selection options list 801 (specific for the purposes of this example—some embodiments implement additional weight generation and select options). Elements of block diagram 800 will now be described in the following few paragraphs.

Default channel weights 802 shows that diverse static or default weights can be assigned to specific channels—weight given to each channel is independent of the other channels;

Dynamic weights 803 shows a mode that allocates the same weight to a specific latch position across all chains;

Latch position range 804 allocates a weight to a range of latch positions for a subset of channels that can include just a single channel, or any combination of channels;

Single latch dynamic weight 805 assigns a specific weight to a single latch position;

Default channel weights 806—assigns default channel weights to blank latches (shown without shading) in the chains (see default channel weights 802);

Specific weight selection 807—applies a weight to a range of latches in a single chain;

Last latch position 808—allocates any weight to the last latch position of any scan chain; and/or First latch position 809—allocates any weight to the first latch position of any scan chain.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Definitions

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

Data communication: any sort of data communication scheme now known or to be developed in the future, including wireless communication, wired communication and communication routes that have wireless and wired portions; data communication is not necessarily limited to: (i) direct data communication; (ii) indirect data communication; and/or (iii) data communication where the format, packetization status, medium, encryption status and/or protocol remains constant over the entire course of the data communication.

Receive/provide/send/input/output/report: unless otherwise explicitly specified, these words should not be taken to imply: (i) any particular degree of directness with respect to the relationship between their objects and subjects; and/or (ii) absence of intermediate components, actions and/or things interposed between their objects and subjects.

Without substantial human intervention: a process that occurs automatically (often by operation of machine logic, such as software) with little or no human input; some examples that involve "no substantial human intervention" include: (i) computer is performing complex processing and a human switches the computer to an alternative power supply due to an outage of grid power so that processing continues uninterrupted; (ii) computer is about to perform resource intensive processing, and human confirms that the resource-intensive processing should indeed be undertaken (in this case, the process of confirmation, considered in isolation, is with substantial human intervention, but the resource intensive processing does not include any substantial human intervention, notwithstanding the simple yes-no style confirmation required to be made by a human); and (iii) using machine logic, a computer has made a weighty decision (for example, a decision to ground all airplanes in anticipation of bad weather), but, before implementing the weighty decision the computer must obtain simple yes-no style confirmation from a human source.

Automatically: without any human intervention.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, and/or application-specific integrated circuit (ASIC) based devices.

The following list expands some acronyms used throughout the present document.

ATPG—Automated test pattern generation.
DUT—Device under test.
LBIST—Logic built-in self test.
PRPG—Pseudo-random pattern generator.
LFSR—Linear feedback shift register.
MISR—Multiple input signature register.
PLL—Phase lock loop, sometimes referred to as phase locked loop.
STUMP—Self Test Using MISRs and Parallel SRSG
SRSG—Shift Register Sequence Generator

What is claimed is:

1. A method for testing a semiconductor chip comprising:
identifying a scan chain, of a logic circuit, of a semiconductor chip, wherein identifying the scan chain is based on: (i) logic built-in self-test (LBSIT), (ii) controls/observes logic network resistance to pseudo-random fault detection and (iii) logic design of the semiconductor chip:
generating a weighted bit chain for testing the scan chain, wherein the weighted bit chain is a pseudo-random sequence of bits, including a first pseudo-random bit, wherein a probability of the first pseudo-random bit is modified by a first weighting factor;
operating the semiconductor chip using the weighted bit chain as input to the scan chain;
determining that a fault of the logic circuit has not been tested, wherein the fault of the logic circuit has not been tested further comprises of simulating untested fault/unmodeled fault;
in response to determining that the fault of the logic circuit has not been tested, dynamically selecting a second weighting factor to generate an alternate weighted bit chain for testing the scan chain, wherein the probability of the first pseudorandom bit is modified by the second weighting factor; and
operating the semiconductor chip using the alternate weighted bit chain as input to the scan chain.

2. The method of claim 1 further comprising:
sending, to a multiplexer integral to the semiconductor chip, a selection signal;
selecting, by the multiplexer, and based on the selection signal, a selected bit chain; and
pushing, onto the scan chain, the selected bit chain, wherein the selected bit chain is selected from the group consisting of the weighted bit chain, and the alternate weighted bit chain and wherein to push is to serially shift or load.

3. The method of claim 1, wherein the scan chain comprises a plurality of channels, wherein each channel, of the plurality of channels, comprises a plurality of channel latches.

4. The method of claim 1, further comprising:
determining a first weighting configuration of the weighted bit chain based on a first dynamic factor; and
determining a second weighting configuration of the weighted bit chain based on a second dynamic factor.

5. The method of claim 2, wherein selecting the selected bit chain controls generating and applying weights by utilizing a dynamic weight selection mode selected from the group consisting of: (i) dynamic and static weight selection; (ii) channel positional based weight selection; (iii) individual channel weights selection; (iv) dynamic latch position and latch range; and (v) force "0" and force "1" selection.

6. The method of claim 5, wherein the dynamic weight selection mode generates a weighted pattern selected from the group consisting of: (i) static weight selection per self test using 'multiple input signature registers' and 'parallel shift register sequence generators' channel (static weight selection per STUMP channel); (ii) dynamic weight selection per channel; (iii) dynamic weight selection per latch; (iv) any combination of channel per dynamic weight; (v) multiple latch positions support; and (vi) 'hold' dynamic channel/weight for a specified range of latch positions.

7. A computer program product comprising a non-transitory computer readable storage medium having stored thereon program instructions programmed to perform:
identifying a scan chain, of a logic circuit, of a semiconductor chip, wherein identifying the scan chain is based on: (i) logic built-in self-test (LBSIT), (ii) controls/observes logic network resistance to pseudo-random fault detection and (iii) logic design of the semiconductor chip;
generating a weighted bit chain for testing the scan chain;
operating the semiconductor chip using the weighted bit chain as input to the scan chain;
determining that a fault of the logic circuit has not been tested;
in response to determining that the fault of the logic circuit has not been tested, dynamically selecting a second weighting factor to generate an alternate weighted bit chain for testing the scan chain, wherein the probability of the first pseudo-random bit is modified by the second weighting factor; and operating the semiconductor chip using the alternate weighted bit chain as input to the scan chain.

8. The computer program product of claim 7 further comprising program instructions programmed to perform:
sending, to a multiplexer integral to the semiconductor chip, a selection signal;
selecting, by the multiplexer, and based on the selection signal, a selected bit chain; and
pushing, onto the scan chain, the selected bit chain, wherein the selected bit chain is selected from the group consisting of the weighted bit chain, and the alternate weighted bit chain and wherein to push is to serially shift or load.

9. The computer program product of claim 7, wherein the scan chain comprises a plurality of channels, wherein each channel, of the plurality of channels, comprises a plurality of channel latches.

10. The computer program product of claim 7, further comprising program instructions programmed to perform:
determining a first weighting configuration of the weighted bit chain based on a first dynamic factor; and
determining a second weighting configuration of the weighted bit chain based on a second dynamic factor.

11. The computer program product of claim 8, wherein selecting the selected bit chain controls generating and applying weights by utilizing a dynamic weight selection mode selected from the group consisting of: (i) dynamic and static weight selection; (ii) channel positional based weight selection; (iii) individual channel weights selection; (iv) dynamic latch position and latch range; and (v) force "0" and force "1" selection.

12. The computer program product of claim 11, wherein the dynamic weight selection mode generates a weighted pattern selected from the group consisting of: (i) static weight selection per self test using 'multiple input signature registers' and 'parallel shift register sequence generators' channel (static weight selection per STUMP channel); (ii) dynamic weight selection per channel; (iii) dynamic weight selection per latch; (iv) any combination of channel per dynamic weight; (v) multiple latch positions support; and (vi) 'hold' dynamic channel/weight for a specified range of latch positions.

13. A computer system comprising:
one or more computer processors;
one or more computer readable non-transitory storage media; and
program instructions stored on the one or more computer readable storage media for execution by at least one of the one or more computer processors, the program instructions, when executed by the one or more computer processors, causing the one or more computer processors:
to identify a scan chain, of a logic circuit, of a semiconductor chip wherein to identify the scan chain is based on: (i) logic built-in self-test (LBSIT), (ii) controls/observes logic network resistance to pseudo-random fault detection and (iii) logic design of the semiconductor chip;
to generate a weighted bit chain for testing the scan chain;
to operate the semiconductor chip using the weighted bit chain as input to the scan chain;
to determine that a fault of the logic circuit has not been tested;
in response to determine that the fault of the logic circuit has not been tested, dynamically selecting a second weighting factor to generate an alternate weighted bit chain for testing the scan chain, wherein the probability of the first pseudo-random bit is modified by the second weighting factor; and
to operate the semiconductor chip using the alternate weighted bit chain as input to the scan chain.

14. The computer system of claim 13 further comprising program instructions programmed to perform:
to send, to a multiplexer integral to the semiconductor chip, a selection signal;
to select by the multiplexer, and based on the selection signal, a selected bit chain; and
to push, onto the scan chain, the selected bit chain, wherein the selected bit chain is selected from the group consisting of the weighted bit chain, and the alternate weighted bit chain and wherein to push is to serially shift or load.

15. The computer system of claim 13, wherein the scan chain comprises a plurality of channels, wherein each channel, of the plurality of channels, comprises a plurality of channel latches.

16. The computer system of claim 13, further comprising:
to determine a first weighting configuration of the weighted bit chain based on a first dynamic factor; and
to determine a second weighting configuration of the weighted bit chain based on a second dynamic factor.

17. The computer system of claim 14, wherein selecting the selected bit chain controls generating and applying weights by utilizing a dynamic weight selection mode selected from the group consisting of: (i) dynamic and static weight selection; (ii) channel positional based weight selection; (iii) individual channel weights selection; (iv) dynamic latch position and latch range; and (v) force "0" and force "1" selection.

18. The computer system of claim 17, wherein the dynamic weight selection mode generates a weighted pattern selected from the group consisting of: (i) static weight selection per self test using 'multiple input signature registers' and 'parallel shift register sequence generators' channel (static weight selection per STUMP channel); (ii) dynamic weight selection per channel; (iii) dynamic weight selection per latch; (iv) any combination of channel per dynamic weight; (v) multiple latch positions support; and (vi) 'hold' dynamic channel/weight for a specified range of latch positions.

* * * * *